(12) United States Patent
Erhart

(10) Patent No.: US 6,686,771 B1
(45) Date of Patent: Feb. 3, 2004

(54) FULL-RANGE EXTENDED VOLTAGE AMPLIFIER

(75) Inventor: Richard Alexander Erhart, Chandler, AZ (US)

(73) Assignee: National Semiconductor Corporation, Santa Clara, CA (US)

(*) Notice: Subject to any disclaimer, the term of this patent is extended or adjusted under 35 U.S.C. 154(b) by 8 days.

(21) Appl. No.: 10/197,087

(22) Filed: Jul. 16, 2002

(51) Int. Cl.[7] .............................................. H03K 19/018
(52) U.S. Cl. ............................. 326/81; 326/68; 326/70
(58) Field of Search ................................. 326/115, 119, 326/121, 124, 126, 63, 68, 75, 70, 76, 77, 80, 81

(56) References Cited

U.S. PATENT DOCUMENTS 5,465,054 A  11/1995  Erhart ........................ 326/34

OTHER PUBLICATIONS

Gulati, K., et al., "SA20.4: A±2.45V–Swing CMOS Telescopic Operational Amplifier," Massachusetts Institute of Technology, Cambridge, MA, pp. 20.4–1—20.4–11, 1998.

Gray, Paul R., et al., *Analysis and Design of Analog Integrated Circuits*, Third Edition, pp. 465–466, copyright 1977, 1993.

*Primary Examiner*—Don Le
(74) *Attorney, Agent, or Firm*—Cahill, von Hellens & Glazer, P.L.C.

(57) ABSTRACT

A differential amplifier circuit receives full range differential input signals, and produces a full range output signal, using CMOS transistors designed for one-half such operating voltage. The positive and negative input signals differentially drive first and second CMOS transistors. The source terminals of such first and second CMOS transistors are coupled to a current steering circuit by a pair of lower protection transistors; the gate terminals of such lower protection transistors are driven by level-shifted counterparts of the positive and negative input signals. The drain terminals of the first and second CMOS transistors are coupled to a common node via a pair of upper protection transistors, the gate terminals of which are also driven by the level-shifted counterparts of the input signals. The common node is coupled to a source of a reference current by an additional protection transistor; the gate terminal of the additional protection transistor is biased at a shield voltage set at the midpoint of the full operating voltage range.

25 Claims, 4 Drawing Sheets

FULL-RANGE EXTENDED VOLTAGE AMPLIFIER

BACKGROUND OF THE INVENTION

1. Field of the Invention

The present invention relates generally to amplifiers for use within integrated circuits, and more particularly, to an amplifier capable of amplifying an input signal, and generating a corresponding output signal, that vary between an extended operating voltage range.

2. Description of the Related Art

CMOS is a widely used technology for integrated circuits, particularly because CMOS transistors can be fabricated using relatively small amounts of semiconductor chip area, and because they minimize power consumption. The electrical properties of CMOS technology are well understood. The voltage that can be used to power CMOS circuits is dependent upon the physical dimensions of the individual transistors (i.e., their geometry) and the particular processing utilized in the manufacturing of the transistors.

Many CMOS integrated circuits can be operated at power supply ranges of 5 volts or less. Processing techniques have been developed and are known to those skilled in the art for producing highly-dense CMOS integrated circuits which operate over a power supply range of 5 volts or less. These integrated circuits produce output signals which also range approximately between ground and +5 volts or less, respectively. It will be understood that mention of +5 volts is merely exemplary, and that CMOS integrated circuits can operate at power supply voltages other than 5 volts. However, the device geometries used to form CMOS transistors must be selected to reliably withstand the power supply operating range in use. Generally speaking, the larger the operating voltage range, the larger device geometries must be used.

In some instances, a CMOS integrated circuit must drive or control some other device which requires an input signal having a voltage magnitude greater than 5 volts (i.e., greater than the power supply operating range for which such CMOS transistors are designed). One example is the need to drive liquid crystal display (LCD) screens of the type used in hand-held games, hand-held computers, laptop/notebook computers, and more recently thin-screen desktop displays. LCD displays used in computer screens require a large number of input control signals which must operate at voltages from 8 volts to as high as 20 volts. In order for a CMOS integrated circuit to generate an output signal having such an increased voltage magnitude, then the power supply range for such CMOS integrated circuit must also have an increased voltage magnitude.

In general, the higher the power supply voltage needed, the larger the individual transistors must be to withstand such increased voltages and to meet reliability standards; in addition, the use of larger power supply voltages necessitates special processing considerations. Larger device geometries and more complex processing generally result in higher manufacturing costs for a particular integrated circuit, since the total area of the integrated circuit, and the complexity of the manufacturing process, are both major factors in determining the cost of a particular circuit.

There are several mechanisms which limit the voltage that a particular CMOS transistor can tolerate. Among the failure mechanisms that can plague such CMOS devices are: a) channel breakdown due to excessive voltage appearing between the source and drain terminals of the CMOS transistor; b) dielectric breakdown of the gate oxide, which is a destructive mechanism; and c) junction breakdown corresponding to the reverse voltage breakdown of the diode which appears at the source and drain of all CMOS transistors.

One circuit technique for allowing CMOS logic integrated circuits to tolerate higher voltages without degradation is described in U.S. Pat. No. 5,465,054, issued to Erhart, and assigned to the assignee of the present invention. In the '054 patent, so-called "super-transistors" are used to allow a full-range input signal to drive CMOS transistors made using a low-voltage CMOS process. Each super-transistor includes a CMOS input shielding transistor and a CMOS switching transistor. Each input shielding transistor has its gate terminal coupled to a shielding voltage set approximately midway between ground potential and the full-range VDD power supply voltage. The shielding transistor is coupled between the full-range input signal and the gate of the switching transistor. The drain of each switching transistor is, in turn, coupled by an output shielding transistor to a full-range output terminal for providing a full-range output signal. The gate terminals of each output shielding transistor are also coupled to the shielding voltage. The input shielding transistors and output shielding transistors prevent any gate oxide voltage or channel voltage from exceeding one-half of the voltage difference between ground potential and the positive power supply voltage VDD, while allowing the output signal to swing full range from ground potential to VDD.

The aforementioned U.S. Pat. No. 5,465,054 discloses various logic gates (inverters, NAND gates, transmission gates). However, CMOS integrated circuits must often include amplifiers for processing analog signals, as well. Such amplifiers may be constructed using larger-geometry devices to reliably tolerate increased power supply voltages, but the use of such larger-geometry devices again increases chip area, particularly when such an amplifier must be repeated tens, or hundreds, of times on a single integrated circuit.

In view of the foregoing, it is an object of the present invention to provide a CMOS amplifier circuit adapted to be fabricated within an integrated circuit using relatively small device geometries, and CMOS processing techniques, normally associated with a low voltage (e.g., 5 volt) power supply range, but which is capable of operating over an extended power supply range to amplify input signals that exceed the typical low voltage range.

It is another object of the present invention to provide such a CMOS amplifier circuit which permits the use of larger power supply voltages for generating output signals of greater voltage magnitude while retaining high density advantages of low-voltage CMOS processing.

It is still another object of the present invention to provide such a CMOS amplifier circuit which uses low-voltage type CMOS transistors in conjunction with higher-voltage power supply ranges while preventing channel breakdown, gate oxide breakdown, and junction breakdown failure modes.

A further object of the present invention is to provide such a CMOS amplifier circuit which uses low-voltage type CMOS transistors in conjunction with higher-voltage power supply ranges without impairing the reliability of such integrated circuits.

A still further object of the present invention is to provide such a CMOS amplifier circuit which uses low-voltage type CMOS transistors in conjunction with higher-voltage power supply ranges without significantly increasing the cost of manufacturing such integrated circuits.

Yet another object of the present invention is to provide such an extended range amplifier that includes differential inputs.

These and other objects of the present invention will become more apparent to those skilled in the art as the description of the present invention proceeds.

SUMMARY OF THE INVENTION

Briefly described, and in accordance with preferred embodiments thereof, the present invention relates to a differential circuit formed between a pair of power supply conductors that define an operating voltage range; the differential circuit includes a negative input terminal and a positive input terminal for receiving first and second voltages, respectively, each ranging within the aforementioned operating voltage range. The differential circuit includes first and second CMOS transistors coupled with each other to form a differential pair; drain terminals of the first and second CMOS transistors are coupled to a source of reference current, while the gate terminals of the first and second CMOS transistors are coupled to the negative input terminal and positive input terminal, respectively, for dividing the reference current between source terminals of the first and second CMOS transistors in accordance with differences between the first and second voltages.

The differential circuit also includes first and second level shift circuits coupled to the negative input terminal and positive input terminal, respectively, for receiving the first and second voltages, and for producing first and second level-shifted voltages; the first level-shifted voltage is of a lower voltage than the first voltage and is, at least partially, responsive to changes in the first voltage. The second level-shifted voltage bears a similar relationship with the second voltage. Preferably, such level-shifted voltages range between the voltage of one of the power supply conductors and a voltage that lies approximately midway between the first and second power supply voltages.

The source terminals of the first and second CMOS transistors are coupled to drain terminals of third and fourth CMOS transistors, respectively. The gate terminal of the third CMOS transistor is coupled to the first level shift circuit for receiving first level-shifted voltage, and the gate terminal of the fourth CMOS transistor is coupled to the second level shift circuit for receiving the second level-shifted voltage. The source terminals of the third and fourth CMOS transistors provide first and second complementary components of the reference current.

In one aspect of the present invention, the differential circuit further includes fifth and sixth CMOS transistors, the source terminals of which are coupled, respectively, to the drain terminals of the first and second CMOS transistors. The gate terminals of the fifth and sixth CMOS transistors are coupled, respectively, to the first and second level shift circuits for receiving, respectively, the first level-shifted voltage and the second level-shifted voltage. The drain terminals of the fifth and sixth CMOS transistors are coupled in common to the source of reference current, preferably through a seventh CMOS transistor; in this case, the seventh CMOS transistor includes a source terminal coupled with the common drain terminals of the fifth and sixth CMOS transistors; the gate terminal of the seventh CMOS transistor is coupled to a shield voltage, and the drain terminal of the seventh CMOS transistor is coupled to the source of reference current. Preferably, the shield voltage that is coupled to the gate terminal of the seventh CMOS transistor is a voltage approximately midway within the operating voltage range defined by the first and second power supply conductors.

In the preferred embodiment of such differential circuit, the first and second CMOS transistors are n-channel devices, while the third, fourth, fifth, sixth, and seventh CMOS transistors are p-channel devices. The first, second, third, fourth, fifth, and sixth CMOS transistors are all characterized by gate-to-source breakdown voltages, and a gate-to-drain breakdown voltages, of less than the operating voltage range defined by the first and second power supply voltages. Thus, such devices are normally designed to operate with a smaller operating voltage and are physically smaller than devices designed to operate at larger operating voltages. However, the above-described differential circuit prevents excessive voltages from developing across the terminals of such CMOS transistors even though the operating voltage range of the differential circuit is extended.

In another aspect of the present invention, the differential circuit is part of a differential amplifier that includes a current steering circuit, a current mirror circuit, and an output port. The current steering circuit has first and second input terminals coupled, as by way of example, via the aforementioned third and fourth CMOS transistors, to the source terminals of the first and second CMOS transistors for receiving the currents conducted thereby. The current steering circuit also includes first and second output terminals for conducting output currents determined in accordance with currents received by the first and second input terminals. The current mirror circuit has an input terminal coupled with the first output terminal of the current steering circuit for conducting the output current supplied thereby; the current mirror circuit also includes an output terminal for conducting a corresponding mirrored current. The output port is coupled to the output terminal of the current mirror circuit and to the second output terminal of the current steering circuit for providing an output voltage within the operating voltage range.

DETAILED DESCRIPTION OF THE PREFERRED EMBODIMENT

Figure 1:
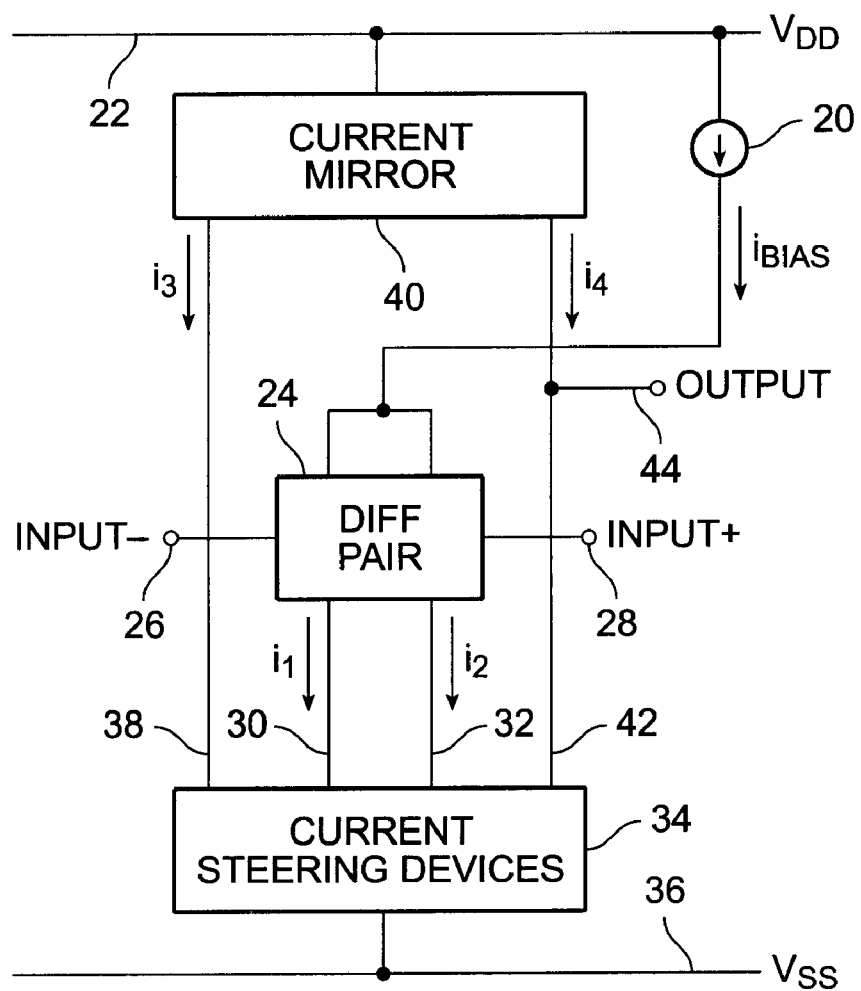
FIG. 1 is a simplified circuit schematic of a prior art differential amplifier using a differential pair of CMOS transistors, a lower current steering circuit, and an upper current mirror circuit.

FIG. 1 is a block diagram of a prior art differential amplifier wherein a bias current, or reference current 20, is coupled between positive power supply (VDD) conductor 22 and a pair of differentially-coupled transistors, represented by block 24. In this example, it is presumed that the positive power supply VDD is at +10 volts, and that the lower power supply (VSS) is at ground, or zero, potential. Diff Pair block 24 includes a negative input terminal 26 and a positive input terminal 28 for receiving a differential input voltage. Diff Pair block 24 splits the reference current provided by reference current 20 into two components, $i_1$ and $i_2$, along conductors 30 and 32, respectively, in accordance with the magnitude and polarity of the differential input voltage. For example, if the voltages applied to negative input terminal 26 and to positive input terminal 28 were equal to each other (i.e., zero differential voltage), then one would expect the two components $i_1$ and $i_2$ flowing through conductors 30 and 32 to be equal to each other.

Conductors 30 and 32 are both coupled through current steering devices block 34 to the lower power supply (VSS) conductor 36. Current steering devices block 34 creates current $i_3$ in conductor 38 proportional to current $i_1$ in conductor 30. Current mirror block 40 conducts current $i_3$ and mirrors an equal current $i_4$ to flow through conductor 42. Conductor 42 is coupled to current steering devices block 34 and to output terminal 44. The output voltage provided by output terminal 44 can swing between the lower power supply voltage VSS and the upper power supply voltage VDD. A common CMOS device implementation of such a differential amplifier is shown in "Analysis and Design of Analog Integrated Circuits", by Gray and Meyer, copyright 1977, at page 465 (see FIG. 6.42 and the textual description directed thereto), incorporated herein by reference.

However, the prior art implementation of such a differential amplifier requires that the CMOS transistors used to form such amplifier must be capable of withstanding gate-to-drain voltages, and gate-to-source, voltages of anywhere between +10 volts and −10 volts. Thus, such CMOS transistors would need to be formed using a 10 volt process, and such devices are significantly larger than CMOS transistors designed to operate over a 5 volt operating range.

Figure 2:
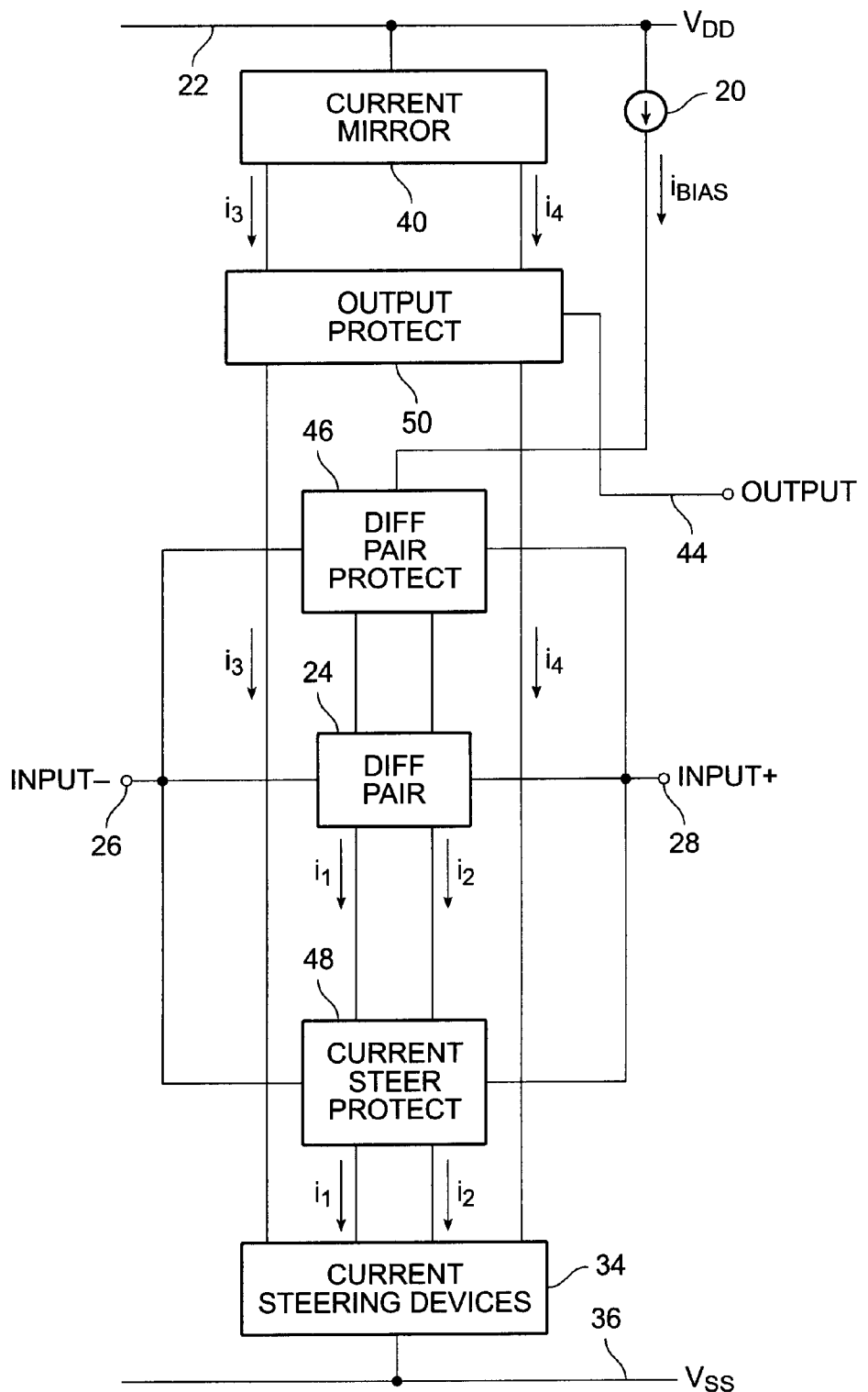
FIG. 2 is a simplified circuit schematic of a differential amplifier constructed with CMOS transistors designed for one-half the actual operating voltage, in accordance with a preferred embodiment of the present invention, and including a current steer protection block, a differential pair protection block, and an output protection block.

In FIG. 2, a modified form of such a differential amplifier is shown in block diagram form. It is once again assumed that the positive power supply VDD on conductor 22 is at +10 volts, and that the lowermost power supply VSS on conductor 36 is at ground, or zero, potential. As shown in FIG. 2, the modified differential amplifier still includes current reference 20, Diff Pair block 24, current steering devices block 34, and current mirror block 40. However, certain protection blocks are added between such components to guard against excessive voltages, thereby allowing all of such circuit components to be fabricated from CMOS transistors that are designed to withstand the lesser operating voltage of +5 volts. For example, Diff Pair Protect block 46 is interposed between Diff Pair block 24 and reference current source 20. Likewise, current steer protect block 48 is interposed between Diff Pair block 24 and current steering devices block 34. In addition, output protect block 50 is interposed between current steering devices block 34 and current mirror circuit 40. These protection blocks 46, 48 and 50 guard against over-voltage conditions, in a manner that will be described below, while still permitting a full-range (zero to +10 volts) output signal swing, and while still permitting full range input voltages (zero to +10 volts) to be applied to the negative and positive input terminals 26 and 28 thereof.

Figure 3:
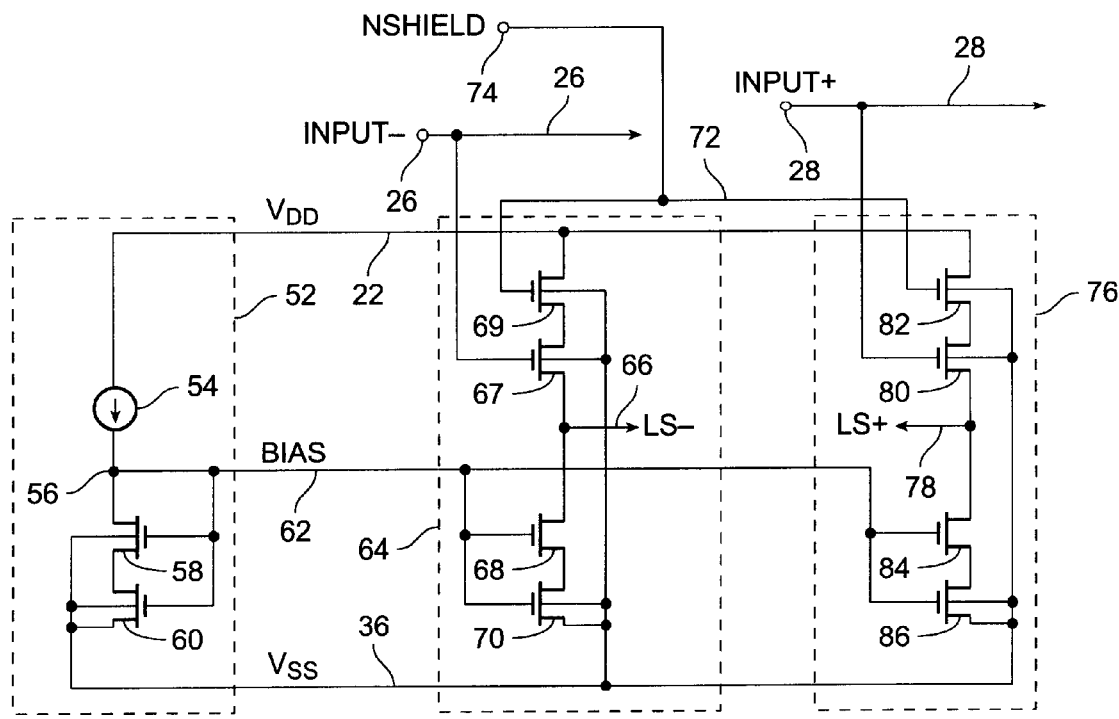
FIG. 3 is a circuit schematic showing a current bias circuit and level-shift circuitry used in the preferred embodiment of the present invention.

Before describing the details of the various circuit blocks shown in FIG. 2, it is first necessary to describe the creation of a bias voltage and two level-shifted signals. Referring to FIG. 3, a bias circuit is shown in dashed box 52. Fixed current source 54 extends between the positive power supply (VDD) conductor 22 and bias voltage node 56 for supplying a fixed current thereto. Bias node 56 is coupled to the gate terminals of series-connected n-channel CMOS transistors 58 and 60; the drain terminal of transistor 58 is also coupled to bias node 56. The source terminal of transistor 58 supplies the fixed current to the drain terminal of transistor 60, and the source terminal of transistor 60 is coupled to the lower power supply (VSS) conductor 36. Bias node 56 thereby establishes a bias voltage on bias conductor 62.

Still referring to FIG. 3, dashed block 64 is a first level shift circuit coupled to negative input terminal 26 for receiving the negative input voltage, and producing on conductor 66 a first level-shifted counterpart (LS−) of such negative input voltage. Series-connected n-channel CMOS transistors 67 and 69 extend from LS− conductor 66 up to the positive voltage supply (VDD) conductor 22; the gate terminal of transistor 67 is coupled to negative input terminal 26. Current source n-channel CMOS transistors 68 and 70 are coupled between LS− conductor 66 and lower power supply conductor 36; the gate terminals of such current source transistors 68 and 70 are coupled to bias voltage conductor 62 for sourcing the same fixed current, through the drain terminal of transistor 68, as supplied by current source 54.

The gate terminal of transistor 69 is coupled to conductor 72 which receives an N-shield voltage at terminal 74. Preferably, the N-shield voltage is selected to lie approximately midway between positive supply voltage VDD and lower most voltage VSS. In the example being used in this description, VDD is +10 volts, VSS is 0 volts, and the N-shield voltage is approximately +5 volts. So long as negative input terminal 26 ranges between 0 volts and +5 volts, transistor 67 is conductive, and LS− conductor 66 will be one gate-to-source threshold voltage ($V_t$) below the original negative input voltage supplied to negative input terminal 26, hence the name "level shifter". However, when the voltage at negative input terminal 26 rises above +5 volts, the source terminal of transistor 69, and hence the drain terminal of transistor 67, is clamped at one gate-to-source threshold voltage ($V_t$) below the N-shield voltage on conductor 72. Since the drain terminal of transistor 67 is clamped at one $V_t$ voltage below the N-shield voltage, then the source terminal, and LS− conductor 66, are also clamped at one $V_t$, voltage below the N-shield voltage (approximately +5 volts−0.5 volts, or +4.5 volts). Were the gate terminal of upper transistor 69 instead tied directly to positive supply conductor 22, and were the negative input terminal 26 to receive a voltage near VDD (i.e., +10 volts), then the voltage on LS− conductor 66 would rise to approximately +9.5 volts, and this voltage would be too large in magnitude to safely drive a next succeeding CMOS n-channel transistor gate input.

Within FIG. 3, dashed block 76 represents a second level-shift circuit coupled to positive input terminal 28 for receiving the positive input voltage, and producing on conductor 78 a second level-shifted counterpart (LS+) of the positive input voltage. Series-connected n-channel CMOS transistors 80 and 82 extend from LS+ conductor 78 up to the positive voltage supply (VDD) conductor 22; the gate terminal of transistor 80 is coupled to positive input terminal 28, so LS+ conductor 78 is always one gate-to-source threshold voltage below the original positive input voltage supplied to positive input terminal 28. Current source n-channel CMOS transistors 84 and 86 are coupled between LS+ conductor 78 and lower power supply conductor 36;

once again, the gate terminals of such current source transistors 84 and 86 are coupled to bias voltage conductor 62 for sourcing the same fixed current, through the drain terminal of transistor 84, as supplied by current source 54. The gate terminal of upper transistor 82 is coupled to the N-shield conductor 72 to prevent over-voltage conditions, as already explained above.

Figure 4:
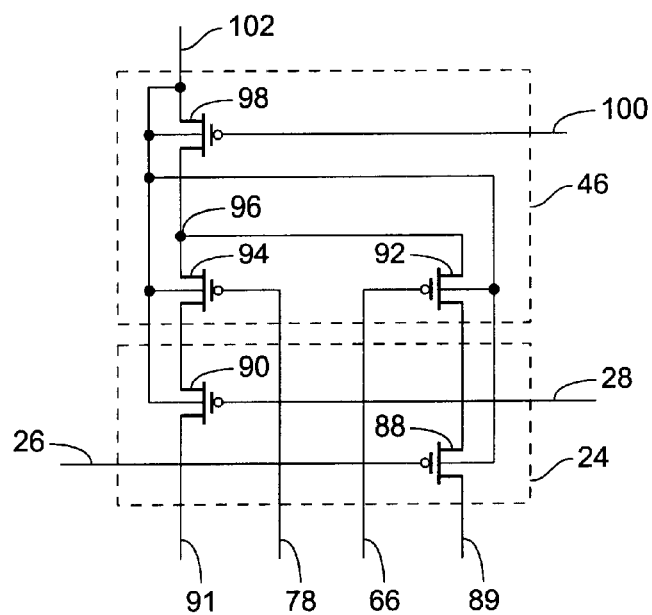
FIG. 4 is a circuit schematic of the CMOS transistors that form the differential pair, and differential pair protection, blocks of FIG. 2.

The circuit schematic of FIG. 4 illustrates the structure of Diff Pair block 24 and Diff Pair Protect block 46. Diff Pair block 24 includes p-channel CMOS transistors 88 and 90 coupled with each other to form a differential pair. The source terminals of transistors 88 and 90 are coupled to conductors 89 and 91, respectively. The gate terminal of CMOS transistor 88 is coupled to negative input terminal 26, and the gate terminal of CMOS transistor 90 is coupled to positive input terminal 28. The drain terminals of CMOS transistors 88 and 90 are coupled, respectively, to the source terminals of p-channel CMOS transistors 92 and 94 within Diff Pair Protect block 46. The gate terminal of protection transistor 92 is coupled to the negative level-shifted LS– signal on conductor 66 (see FIG. 3), and the gate terminal of transistor 94 is coupled to the positive level-shifted LS+ signal on conductor 78 (see FIG. 3). The drain terminals of protection transistors 92 and 94 are coupled in common to each other at node 96. P-channel CMOS transistor 98 of Diff Pair Protect block 46 has its source terminal coupled to node 96. The gate terminal of transistor 98 is coupled to P-shield conductor 100; the P-shield voltage applied to conductor 100 is preferably selected to be approximately midway between the positive supply voltage VDD (+10 volts, in our example) and the lowermost voltage VSS (0 volts, in our example), or +5volts. The drain terminal of transistor 98 is coupled to conductor 102; conductor 102 receives the reference current $i_{bias}$ supplied by reference current source 20 (see FIG. 2). Differential transistors 88 and 90 divide the reference current $i_{bias}$ supplied by reference current source 20 between conductors 89 and 91 in accordance with differences between the negative and positive input voltages supplied on terminals 26 and 28.

Upper protection transistors 92 and 94 serve to protect differential transistors 88 and 90 in cases where the input terminals 26 and 28 are at or near opposite extremes of the input voltage range (e.g., when negative input terminal 26 is at or near the most positive voltage of+10 volts, and positive input terminal 28 is at or near zero volts). Assume, for example, that negative input terminal 26 is at +9.5 volts (one $V_t$ below +10 volts) and positive input terminal 28 is at +0.5 volts (one $V_t$ above zero volts); in this case, the gate terminal of p-channel transistor 90 is at +0.5 volts, the gate terminal of p-channel transistor 88 is at +9.5 volts, and common drain node 96 is at approximately +1.0 volt. Even though the voltage at negative input terminal 26 is at +9.5 volts, the level-shifted signal LS– on conductor 66 does not rise above +4.5 volts. Thus, the voltage of +4.5 volts is applied to the gate terminal of protection transistors 92. If the drain terminal of differential transistor 88 had been coupled directly to common drain node 96, then the gate-to-drain voltage across transistor 88 would be approximately 8.5 volts, far in excess of the design parameters for devices fabricated for a 5-volt process. However, since the gate terminal of transistor 92 is clamped at +4.5 volts by level-shifted signal LS– on conductor 66, the voltage at the drain terminal of differential transistor 88 never falls below 4.5 volts; accordingly, the gate-to-drain voltage across differential transistor 88 never exceeds 5 volts.

Figure 5:
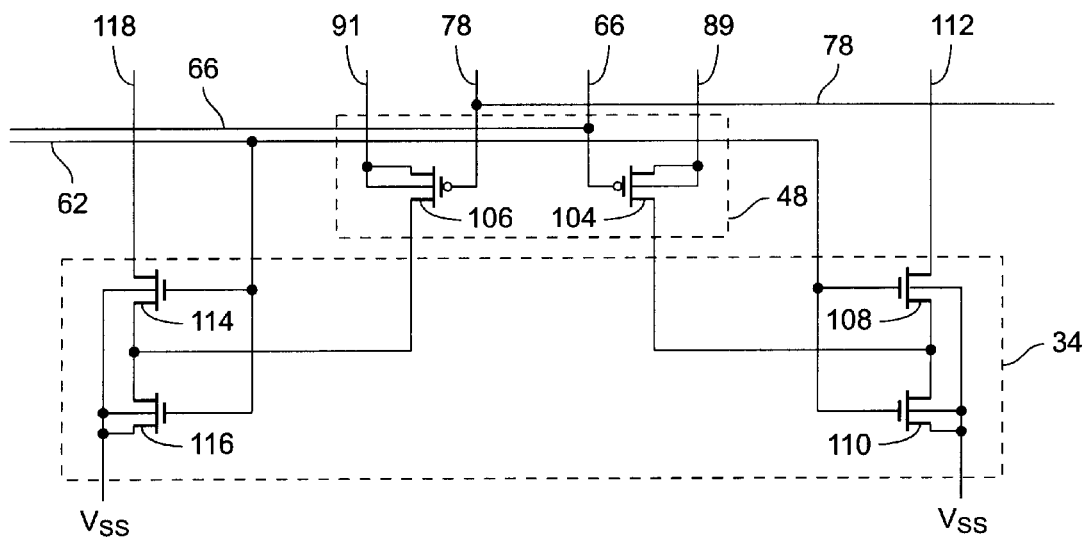
FIG. 5 is a circuit schematic of the CMOS transistors that form the current steering protection, and current steering devices, blocks of FIG. 2.

The circuit schematic of FIG. 5 shows a preferred configuration of the current steer protect block 48 and the current steering devices block 34. P-channel CMOS transistors 104 and 106 within current steer protect block 48 have their drain terminals coupled to conductors 89 and 91, respectively, leading from the source terminals of differential transistors 88 and 90 in Diff Pair block 24 (see FIG. 4). The gate terminal of transistor 104 is coupled to the negative level-shifted signal LS– on conductor 66 (see FIG. 3), while the gate terminal of transistor 106 is coupled to the positive level-shifted signal LS+ on conductor 78.

The source terminal of protect transistor 104 is coupled to the junction between the source terminal of n-channel CMOS transistor 108 and the drain terminal of n-channel CMOS transistor 110, both within the current steering block 34. The gate terminals of transistors 108 and 110 are both coupled to bias conductor 62, so lower transistor 110 conducts a fixed bias current. Upper transistor 108 conducts a current that has a magnitude equal to the fixed bias current conducted by transistor 110 less the current component supplied through conductor 89 via the source terminal of protect transistor 104. The drain terminal of transistor 108 is coupled to conductor 112, which in turn leads up to the output protection block 50 (see FIGS. 2 and 6). The source terminal of lower transistor 110 is coupled to the lowermost power supply VSS.

Likewise, the source terminal of protect transistor 106 is coupled to the junction between the source terminal of n-channel CMOS transistor 114 and the drain terminal of n-channel CMOS transistor 116 within the current steering block 34. The gate terminals of transistors 114 and 116 are both coupled to bias conductor 62, so lower transistor 116 conducts a fixed bias current. Upper transistor 114 conducts a current that has a magnitude equal to the fixed bias current conducted by transistor 116 less the current component supplied through conductor 91 via the source terminal of protect transistor 106. The drain terminal of transistor 114 is coupled to conductor 118, which in turn leads up to the output protection block 50 (see FIGS. 2 and 6). The source terminal of lower transistor 116 is coupled to the lowermost power supply VSS.

Protection transistors 104 and 106 protect transistors 88 and 90 against excessive gate-to-source voltages that might otherwise result if positive input terminal 28 or negative input terminal 26 were at a voltage near positive voltage supply VDD (+10 volts, in our example). It should be noted that the voltages at the drain terminals of transistors 110 and 116 tend to remain at approximately one $V_t$ above ground, or about +.5 volts. If negative input terminal 26 were pulled up to +9.5 volts, then the voltage on the gate terminal of differential transistor 88 would be at +9.5 volts; if the source terminal of differential transistor 88 were coupled directly to the drain terminal of transistor 110, then the voltage at the source terminal of differential transistor 88 would be at +0.5 volts, but this would create a 9 volt difference across the gate-to-source region of differential transistor 88, which would exceed the design parameters of devices designed for a 5 volt process. By instead inserting protection transistor 104 between the source of differential transistor 88 and the drain terminal of transistor 110, and by limiting the maximum voltage on negative level-shifted signal LS– on conductor 66 to +4.5 volts, the drain terminal of protection transistor 104 is prevented from falling below +4.5 volts, and the gate-to-source voltage across differential transistor 88 is therefore prevented from exceeding 5 volts. Protection transistor 106, together with the positive level-shifted signal LS+ on conductor 78, function in a similar manner to protect the gate-to-source region of differential transistor 90 in those instances when the positive input terminal 28 is pulled up near the positive supply voltage.

Those skilled in the art should appreciate that the addition of protection transistors 92, 94, 106, and 108, and the use of the level-shifted signals LS− and LS+, do not in any way impede the basic operation of differential pair transistors 88 and 90, nor do they impede the basic function of the differential amplifier. As described above, the level-shifted signals LS− and LS+ on conductors 66 and 78, respectively, are always at least one $V_t$ voltage below the original negative input and positive input signals 26 and 28. Accordingly, differential transistors 88 and 90 will always remain in saturation and operate as a differential pair, while protection transistors 92 and 94 operate in the linear mode and merely look like resistors. Similarly, protection transistors 104 and 106 merely appear as cascodes to the differential transistors 88 and 90, and actually improve the operation of the differential amplifier by limiting the drain-to-source voltages across differential transistors 88 and 90.

Figure 6:
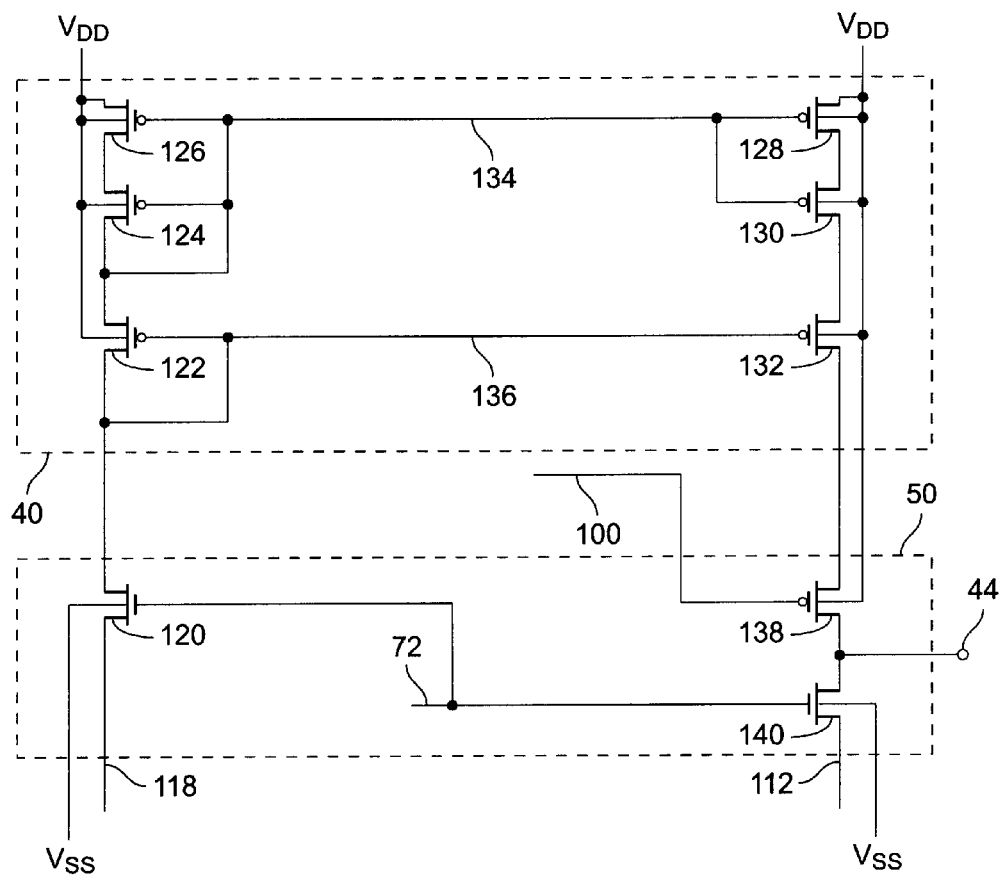
FIG. 6 is a circuit schematic of the CMOS transistors that form the current mirror, and output protection, blocks of FIG. 2.

The schematic of FIG. 6 illustrates the configuration of the current mirror block 40 and the output protect block 50. Transistor 120 within output protect block 50 is an n-channel CMOS transistor having its source terminal coupled to conductor 118 for conducting the current sunk by transistor 114 in current steering block 34 (see FIG. 5). The gate terminal of transistor 120 is coupled to conductor 72 for receiving the N-shield voltage applied to terminal 74 (see FIG. 3). The drain terminal of transistor 120 is coupled to the gate and source terminals of p-channel CMOS transistor 122 within current mirror block 40. The drain terminal of transistor 122 is coupled in series by two p-channel CMOS transistors 124 and 126 up to the positive voltage power supply VDD conductor 22. The gate terminals of transistors 124 and 126 are coupled in common to the source terminal of transistor 124.

Current mirror block 40 also includes p-channel CMOS transistors 128, 130 and 132. The drain terminal of transistor 128 is coupled to the positive voltage power supply VDD conductor 22. The source terminal of transistor 128 is coupled in series with the drain terminal of transistor 130, and the source terminal of transistor 130 is coupled in series with the drain terminal of transistor 132. Conductor 134 couples the gate terminals of transistors 128 and 130 to the gate terminals of transistors 124 and 126 for biasing transistors 128 and 130 to conduct the same current conducted by transistors 124 and 126. Likewise, conductor 136 couples the gate terminal of transistor 132 to the gate terminal of transistor 122 for inducing a current to flow through transistor 132 that mirrors the current flowing through transistor 122, and hence, the current flowing through conductor 118.

Output protect block 50 further includes a p-channel CMOS transistor 138 coupled between the source terminal of transistor 132 and output terminal 44. The gate terminal of transistor 138 is coupled to conductor 100 for receiving the P-shield voltage on conductor 100. As mentioned above relative to FIG. 4, the P-shield voltage is selected to be approximately midway within the operating voltage range. Thus, even if the output voltage at output terminal 44 goes low to zero volts, the voltage at the drain terminal of transistor 138 will be clamped at one threshold voltage above the P-shield voltage, thereby avoiding any excessive gate-to-source voltage across transistor 132 in current mirror block 40. Output terminal 44 is also coupled to the drain terminal of n-channel CMOS transistor 140. The gate terminal of transistor 140 is coupled to the N-shield voltage on conductor 72, and the source terminal of transistor 140 is coupled to conductor 112 for sourcing current to the drain terminal of transistor 108 in current steering block 34 (see FIG. 5). In the event that the voltage on output terminal 44 drops to zero volts, then transistor 140 clamps the voltage on conductor 112 at one threshold voltage below the N-shield voltage, thereby preventing the gate-to-drain voltage across transistor 108 from becoming excessive. In a similar fashion, transistor 120 prevents the gate-to-drain voltage across current steering transistor 114 from becoming excessive.

Since the voltages applied across the gate-to-source, and gate-to-drain, junctions of the various CMOS transistors described above never exceed one-half of the operating voltage (i.e., never exceed +5 volts or −5volts, in the example wherein VDD=+10 volts and VSS=0 volts), the CMOS transistors used to make up the differential amplifier can be fabricated using a process designed for one-half of the operating voltage (i.e., a five volt process for the example described above). Yet, the input voltages applied to negative input terminal 26 and positive input terminal 28, and the output voltage generated at output terminal 44, can range fully between VDD (+10 volts) and VSS (zero volts).

The differential amplifier described above can be used in several ways. For example, it can be used as a differential amplifier by applying a differential input signal to input terminals 26 and 28. It can also be used as a single-ended input feedback amplifier by coupling output terminal 44 to negative input terminal 26 through a suitable feedback impedance. It can also be used as a comparator by coupling a reference voltage to the negative input terminal 26 and "comparing" the voltage applied to positive input terminal 28 to such reference voltage. None of the protection transistors described above preclude the operation of the differential amplifier in unity gain mode, if such operation is desired by the user.

Those skilled in the art will now appreciate that a full-range, extended voltage amplifier has been described which can operate differentially or in a single-ended fashion over an entire operating voltage range even though the transistors used to provide such amplifier are only designed to reliably withstand one-half of such operating voltage range. The disclosed CMOS amplifier circuit can be fabricated within an integrated circuit using relatively small device geometries, and low-voltage CMOS processing techniques, while being capable of operating over an extended power supply range. As a result, the invention permits the use of larger power supply voltages for generating output signals of greater voltage magnitude while retaining high density advantages of low-voltage CMOS processing. Through the use of appropriate protection transistors and shield voltages, the present invention avoids channel breakdown, gate oxide breakdown, and junction breakdown failure modes that might otherwise jeopardize the reliable operation of the amplifier. Moreover, this extended voltage operation is achieved without any significant manufacturing cost. While the present invention has been described with respect to a preferred embodiment thereof, such description is for illustrative purposes only, and is not to be construed as limiting the scope of the invention. Various modifications and changes may be made to the described embodiments by those skilled in the art without departing from the true spirit and scope of the invention as defined by the appended claims.

I claim:

1. A differential circuit comprising in combination:
   a. first and second power supply conductors for conducting first and second power supply voltages, respectively, defining an operating voltage range;
   b. a negative input terminal for receiving a first voltage within the operating voltage range;

c. a positive input terminal for receiving a second voltage within the operating voltage range;

d. first and second CMOS transistors each having drain, source, and gate terminals, the gate terminal of the first CMOS transistor being coupled to the negative input terminal, and the gate terminal of the second CMOS transistor being coupled to the positive input terminal;

e. a first level shift circuit coupled to the negative input terminal for receiving the first voltage and producing a first level-shifted voltage, the first level-shifted voltage being at least partially responsive to the first voltage, the first level-shifted voltage being less than the first voltage;

f. a second level shift circuit coupled to the positive input terminal for receiving the second voltage and producing a second level-shifted voltage, the second level-shifted voltage being at least partially responsive to the second voltage, the second level-shifted voltage being less than the second voltage;

g. a third CMOS transistor having source, gate, and drain terminals, the drain terminal thereof being coupled to the source terminal of the first CMOS transistor, the gate terminal thereof being coupled to the first level shift circuit for receiving the first level-shifted voltage, the source terminal of the third CMOS transistor conducting a current conducted by the source terminal of the first CMOS transistor;

h. a fourth CMOS transistor having source, gate, and drain terminals, the drain terminal thereof being coupled to the source terminal of the second CMOS transistor, the gate terminal thereof being coupled to the second level shift circuit for receiving the second level-shifted voltage, the source terminal of the fourth CMOS transistor conducting a current conducted by the source terminal of the second CMOS transistor;

i. a fifth CMOS transistor having source, gate and drain terminals, the source terminal thereof being coupled to the drain terminal of the first CMOS transistor, and the gate terminal thereof being coupled to the first level shift circuit for receiving the first level-shifted voltage; and j. a sixth CMOS transistor having source, gate and drain terminals, the source terminal thereof being coupled to the drain terminal of the second CMOS transistor, the gate terminal thereof being coupled to the second level shift circuit for receiving the second level-shifted voltage, and the drain terminal thereof being coupled in common to the drain terminal of the fifth CMOS transistor; and k. a source of a reference current coupled between one of the power supply conductors and the common drain terminals of the fifth and sixth CMOS transistors.

2. The differential circuit recited by claim 1 wherein:

a. the first level shifted voltage ranges between the voltage of one of the power supply conductors and a voltage that lies approximately midway between the first and second power supply voltages; and b. the second level shifted voltage ranges between the voltage of one of the power supply conductors and a voltage that lies approximately midway between the first and second power supply voltages.

3. The differential circuit recited by claim 2 wherein the first, second, third, fourth, fifth, and sixth CMOS transistors are all characterized by gate-to-source breakdown voltages, and a gate-to-drain breakdown voltages, of less than the operating voltage range defined by the first and second power supply voltages.

4. The differential circuit recited by claim 1 wherein the first, second, third, fourth, fifth, and sixth CMOS transistors are all characterized by gate-to-source breakdown voltages, and a gate-to-drain breakdown voltages, of less than the operating voltage range defined by the first and second power supply voltages.

5. The differential circuit recited by claim 1 including:

a. a source of a shield voltage; and b. a seventh CMOS transistor having source, gate and drain terminals, the source terminal thereof being coupled to the common drain terminals of the fifth and sixth CMOS transistors, the gate terminal thereof receiving the shield voltage, and the drain terminal thereof being coupled to the source of reference current.

6. The differential circuit recited by claim 5 wherein the shield voltage is a voltage approximately within the middle of the operating voltage range defined by the first and second power supply conductors.

7. The differential circuit recited by claim 1 wherein the first and second CMOS transistors divide the reference current between the source terminals thereof into first and second components of the reference current in accordance with differences between the first and second voltages applied to the gate terminals thereof.

8. The differential circuit recited by claim 1 wherein the first and second CMOS transistors are n-channel devices, and wherein the third, fourth, fifth, and sixth CMOS transistors are p-channel devices.

9. A differential amplifier comprising in combination:

a. first and second power supply conductors for conducting first and second power supply voltages, respectively, defining an operating voltage range;

b. a negative input terminal for receiving a first voltage within the operating voltage range;

c. a positive input terminal for receiving a second voltage within the operating voltage range;

d. a source of a reference current;

e. first and second CMOS transistors coupled with each other to form a differential pair, the first and second CMOS transistors each having drain, source, and gate terminals, the drain terminals of the first and second CMOS transistors being coupled to the source of reference current, the gate terminal of the first CMOS transistor being coupled to the negative input terminal, and the gate terminal of the second CMOS transistor being coupled to the positive input terminal, the first and second CMOS transistors dividing the reference current between the source terminals thereof in accordance with differences between the first and second voltages;

f. a current steering circuit having first and second input terminals coupled to the source terminals of the first and second CMOS transistors, the current steering circuit having first and second output terminals for conducting output currents determined in accordance with currents received from the source terminals of the first and second CMOS transistors;

g. a current mirror circuit having an input terminal and an output terminal, the input terminal being coupled with one of the output terminals of the current steering circuit for conducting the output current supplied thereby, the current mirror circuit causing a corresponding current to flow through the output terminal of the current mirror circuit;

h. an output port coupled to the output terminal of the current mirror circuit and coupled to an output terminal of the current steering circuit for providing an output voltage within the operating voltage range;

i. a first level shift circuit coupled to the negative input terminal for receiving the first voltage and producing a first level-shifted voltage, the first level-shifted voltage being at least partially responsive to the first voltage, the first level-shifted voltage being less than the first voltage;

j. a second level shift circuit coupled to the positive input terminal for receiving the second voltage and producing a second level-shifted voltage, the second level-shifted voltage being at least partially responsive to the second voltage, the second level-shifted voltage being less than the second voltage;

k. a first protection circuit interposed between the differential pair and the current steering circuit, the first protection circuit including a third CMOS transistor having source, gate, and drain terminals, the drain terminal thereof being coupled to the source terminal of the first CMOS transistor, the gate terminal thereof being coupled to the first level shift circuit for receiving the first level-shifted voltage, and the source terminal thereof being coupled to the first input terminal of the current steering circuit; and l. the first protection circuit further including a fourth CMOS transistor having source, gate, and drain terminals, the drain terminal thereof being coupled to the source terminal of the second CMOS transistor, the gate terminal thereof being coupled to the second level shift circuit for receiving the second level-shifted voltage, and the source terminal thereof being coupled to the second input terminal of the current steering circuit.

10. The differential amplifier recited by claim 9 wherein:

a. the first level shifted voltage ranges between the voltage of one of the power supply conductors and a voltage that lies approximately midway between the first and second power supply voltages; and b. the second level shifted voltage ranges between the voltage of one of the power supply conductors and a voltage that lies approximately midway between the first and second power supply voltages.

11. The differential amplifier recited by claim 10 wherein the first, second, third and fourth CMOS transistors are all characterized by gate-to-source breakdown voltages, and a gate-to-drain breakdown voltages, of less than the operating voltage range defined by the first and second power supply voltages.

12. The differential amplifier recited by claim 9 wherein the first, second, third and fourth CMOS transistors are all characterized by gate-to-source breakdown voltages, and a gate-to-drain breakdown voltages, of less than the operating voltage range defined by the first and second power supply voltages.

13. The differential amplifier recited by claim 9 wherein the current steering circuit includes:

a. a fifth CMOS transistor having source, gate and drain terminals, the source terminal being coupled to one of the power supply conductors, the gate terminal being coupled to a bias voltage, and the drain terminal being coupled to the first input terminal of the current steering circuit;

b. a sixth CMOS transistor having source, gate and drain terminals, the source terminal being coupled to the drain terminal of the fifth CMOS transistor, the gate terminal being coupled to a bias voltage, and the drain terminal being coupled to the first output terminal of the current steering circuit;

c. a seventh CMOS transistor having source, gate and drain terminals, the source terminal being coupled to one of the power supply conductors, the gate terminal being coupled to a bias voltage, and the drain terminal being coupled to the second input terminal of the current steering circuit;

d. an eighth CMOS transistor having source, gate and drain terminals, the source terminal being coupled to the drain terminal of the seventh CMOS transistor, the gate terminal being coupled to a bias voltage, and the drain terminal being coupled to the second output terminal of the current steering circuit.

14. The differential amplifier recited by claim 13 further including:

a. a ninth CMOS transistor having source, gate and drain terminals, the source terminal being coupled to the first output terminal of the current steering circuit, the gate terminal being coupled to a shield voltage, and the drain terminal being coupled to the input terminal of the current mirror circuit; and b. a tenth CMOS transistor having source, gate and drain terminals, the source terminal being coupled to the second output terminal of the current steering circuit, the gate terminal being coupled to the shield voltage, and the drain terminal being coupled to the output terminal of the current mirror circuit.

15. The differential amplifier recited by claim 14 wherein the shield voltage is a voltage approximately within the middle of the operating voltage range defined by the first and second power supply voltages.

16. The differential amplifier recited by claim 9 wherein the first and second CMOS transistors are n-channel devices, and wherein the third and fourth CMOS transistors are p-channel devices.

17. The differential amplifier recited by claim 9 further including:

a. a fifth CMOS transistor having source, gate and drain terminals, the source terminal being coupled to the first output terminal of the current steering circuit, the gate terminal being coupled to a shield voltage, and the drain terminal being coupled to the input terminal of the current mirror circuit; and b. a sixth CMOS transistor having source, gate and drain terminals, the source terminal being coupled to the second output terminal of the current steering circuit, the gate terminal being coupled to a shield voltage, and the drain terminal being coupled to the output terminal of the current mirror circuit.

18. The differential amplifier recited by claim 17 wherein the shield voltage is a voltage approximately within the middle of the operating voltage range defined by the first and second power supply voltages.

19. The differential amplifier recited by claim 9 further including:

a. a fifth CMOS transistor having source, gate and drain terminals, the source terminal, being coupled to the drain terminal of the first CMOS transistor, the gate terminal being coupled to the first level shift circuit for receiving the first level-shifted voltage; and b. a sixth CMOS transistor having source, gate and drain terminals, the source terminal being coupled to the drain terminal of the second CMOS transistor, the gate terminal being coupled to the second level shift circuit for receiving the second level-shifted voltage, and the drain terminal being coupled to drain terminal of the fifth CMOS transistor and to the source of reference current.

20. The differential amplifier recited by claim 19 further including a seventh CMOS transistor having source, gate and drain terminals, the source terminal being coupled to the drain terminals of the fifth and sixth CMOS transistors, the gate terminal being coupled to a shield voltage, and the drain terminal being coupled to the source of reference current.

21. The differential amplifier recited by claim 20 wherein the shield voltage is a voltage approximately within the middle of the operating voltage range defined by the first and second power supply conductors.

22. The differential amplifier recited by claim 19 wherein the first and second CMOS transistors are n-channel devices, and wherein the third, fourth, fifth and sixth CMOS transistors are p-channel devices.

23. A method of extending the voltage range over which a differential circuit can reliably operate, the differential circuit including first and second power supply conductors (22, 36) for conducting first and second power supply voltages, respectively, defining an operating voltage range, the differential circuit also including a negative input terminal (26) and a positive input terminal (28) for receiving first and second input voltages, respectively, within the operating voltage range, the differential circuit also including first and second CMOS transistors (88, 90) each having drain, source, and gate terminals, the gate terminal of the first CMOS transistor (88) being coupled to the negative input terminal (26) for receiving the first input voltage, and the gate terminal of the second CMOS transistor (90) being coupled to the positive input terminal (28) for receiving the second input voltage, the first and second CMOS transistors conducting a shared reference current (20/102), the shared reference current being divided between the first and second CMOS transistors in accordance with differences between the first and second input voltages, the first and second CMOS transistors each being characterized by a gate-to-source breakdown voltage, and each being characterized by a gate-to-drain breakdown voltage, of less than the operating voltage range defined by the first and second power supply voltages, said method comprising the steps of:

a. level shifting the first input voltage (26) to produce a first level-shifted voltage (66), the first level-shifted voltage being at least partially responsive to the first input voltage, the first level-shifted voltage (66) always being less than the first input voltage (26), and the first level shifted voltage ranging between the voltage of one of the power supply conductors and a voltage that lies approximately midway between the first and second power supply voltages;

b. level shifting the second input voltage (28) to produce a second level-shifted voltage (78), the second level-shifted voltage being at least partially responsive to the second input voltage, the second level-shifted voltage (78) always being less than the second input voltage (28), and the second level shifted voltage ranging between the voltage of one of the power supply conductors and a voltage that lies approximately midway between the first and second power supply voltages;

c. coupling the source terminal of the first CMOS transistor (88) to a drain terminal of a third CMOS transistor (104), coupling the gate terminal of the third CMOS transistor (104) to the first level-shifted voltage (66), and using the source terminal of the third CMOS transistor (104) to conduct current conducted by the source terminal of the first CMOS transistor (88);

d. coupling the source terminal of the second CMOS transistor (90) to a drain terminal of a fourth CMOS transistor (106), coupling the gate terminal of the fourth CMOS transistor (106) to the second level-shifted voltage (78), and using the source terminal of the fourth CMOS transistor (106) to conduct current conducted by the source terminal of the second CMOS transistor (90).

24. A method of extending the voltage range over which a differential circuit can reliably operate, the differential circuit including first and second power supply conductors (22, 36) for conducting first and second power supply voltages, respectively, defining an operating voltage range, the differential circuit also including a negative input terminal (26) and a positive input terminal (28) for receiving first and second input voltages, respectively, within the operating voltage range, the differential circuit also including first and second CMOS transistors (88, 90) each having drain, source, and gate terminals, the gate terminal of the first CMOS transistor (88) being coupled to the negative input terminal (26) for receiving the first input voltage, and the gate terminal of the second CMOS transistor (90) being coupled to the positive input terminal (28) for receiving the second input voltage, the first and second CMOS transistors (88, 90) conducting a shared reference current (20/102), the shared reference current being divided between the first and second CMOS transistors (88, 90) in accordance with differences between the first and second input voltages, the first and second CMOS transistors (88, 90) each being characterized by a gate-to-source breakdown voltage, and each being characterized by a gate-to-drain breakdown voltage, of less than the operating voltage range defined by the first and second power supply voltages, said method comprising the steps of:

a. level shifting the first input voltage (26) to produce a first level-shifted voltage (66), the first level-shifted voltage (66) being at least partially responsive to the first input voltage (26), the first level-shifted voltage always (66) being less than the first input voltage (26), and the first level shifted voltage (66) ranging between the voltage of one of the power supply conductors and a voltage that lies approximately midway between the first and second power supply voltages;

b. level shifting the second input voltage (28) to produce a second level-shifted voltage (78), the second level-shifted voltage (78) being at least partially responsive to the second input voltage (28), the second level-shifted voltage (78) always being less than the second input voltage (28), and the second level shifted voltage (78) ranging between the voltage of one of the power supply conductors and a voltage that lies approximately midway between the first and second power supply voltages;

c. coupling the drain terminal of the first CMOS transistor (88) to a source terminal of a third CMOS transistor (92), coupling the gate terminal of the third CMOS transistor (92) to the first level-shifted voltage (66), and using the drain terminal of the third CMOS transistor (92) to conduct current conducted by the drain terminal of the first CMOS transistor (88);

d. coupling the drain terminal of the second CMOS transistor (90) to a source terminal of a fourth CMOS transistor (94), coupling the gate terminal of the fourth CMOS transistor (94) to the second level-shifted voltage (78), and using the drain terminal of the fourth CMOS transistor (94) to conduct current conducted by the drain terminal of the second CMOS transistor (90); and e. coupling in common the drain terminals of the third and fourth CMOS transistors (92, 94) to share the shared reference current (20/102).

25. The method recited by claim 24 further including the steps of:

f. coupling the source terminal of the first CMOS transistor (88) to a drain terminal of a fifth CMOS transistor (104), coupling the gate terminal of the fifth CMOS transistor (104) to the first level-shifted voltage (66), and using the source terminal of the fifth CMOS transistor (104) to conduct current conducted by the source terminal of the first CMOS transistor (88);

g. coupling the source terminal of the second CMOS transistor (90) to a drain terminal of a sixth CMOS transistor (106), coupling the gate terminal of the sixth CMOS transistor (106) to the second level-shifted voltage (78), and using the source terminal of the sixth CMOS transistor (106) to conduct current conducted by the source terminal of the second CMOS transistor (90).

\* \* \* \* \*